United States Patent [19]
Lee

[11] Patent Number: 5,825,713
[45] Date of Patent: Oct. 20, 1998

[54] DUAL PORT MEMORY DEVICE AND A METHOD THEREFOR

[75] Inventor: Chul-kyu Lee, Suwon, Rep. of Korea

[73] Assignee: Samsung Electronics Co., Ltd., Kyungki-Do, Rep. of Korea

[21] Appl. No.: 598,317

[22] Filed: Feb. 8, 1996

[30] Foreign Application Priority Data

Feb. 8, 1995 [KR] Rep. of Korea ............... 1995/2271

[51] Int. Cl.$^6$ ............................................. G11C 8/00
[52] U.S. Cl. ............... 365/230.05; 365/221; 365/230.09
[58] Field of Search ................... 365/230.05, 230.09, 365/221

[56] References Cited

U.S. PATENT DOCUMENTS

| | | | |
|---|---|---|---|
| 5,042,014 | 8/1991 | Pinkham et al. | 365/230.05 |
| 5,287,324 | 2/1994 | Nagashima | 365/230.05 |
| 5,379,263 | 1/1995 | Ogawa et al. | 365/230.04 |
| 5,475,649 | 12/1995 | Balistreri et al. | 365/230.02 |
| 5,617,368 | 4/1997 | Ishida | 362/221 |
| 5,661,692 | 8/1997 | Pinkham et al. | 365/230.05 |

*Primary Examiner*—David C. Nelms
*Assistant Examiner*—Hoai Ho
*Attorney, Agent, or Firm*—Cushman Darby & Cushman IP Group of Pillsbury Madison & Sutro LLP

[57] ABSTRACT

A dual port memory device and method for outputting serial data at a high speed from a memory array through a data register. The device includes a RAM port and a SAM port. The SAM port receives start column address data from the RAM port during a transfer cycle and the data register is filled with row data from a specified row. During this process, the start column address is latched and incremented, then the incremented address loaded into a serial counter as an initial address to set up a pipeline serial output. After completion of the transfer cycle, the serial counter is controlled by a serial clock and causes column data to be prefetched from the data register and supplied to an output buffer for serial output. Because of the pipeline configuration, data is serially output at a high speed.

11 Claims, 14 Drawing Sheets

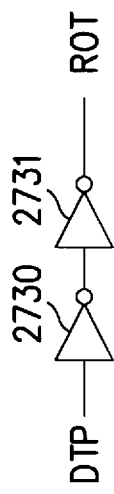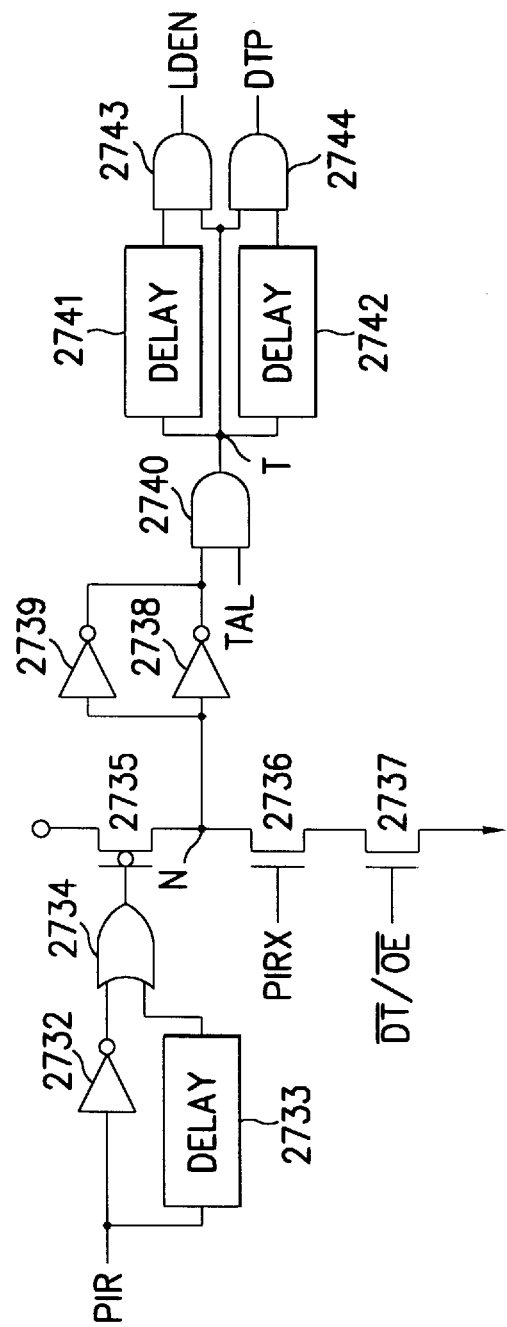
FIG. 16
Fig. 17

DUAL PORT MEMORY DEVICE AND A METHOD THEREFOR

BACKGROUND OF THE INVENTION

1. Field of the Invention

The present invention relates to a dual port memory device, and more particularly, to a dual port memory device and method for outputting serial data at high speeds.

2. Description of the Related Art

In general, dual port memory devices such as video random access memories (RAMs) provide serial access memory (hereinafter referred to as "SAM") functions to realize high speed data transfer, in addition to standard dynamic random access memory (DRAM) functions, which enable the video RAM to be asynchronously utilized.

One conventional video RAM device and operation method is disclosed in U.S. Pat. No. 4,498,155 entitled "Semiconductor Integrated Circuit Memory Device with Both Serial and Random Access Arrays" and dated Feb. 5, 1985. In this video RAM, the DRAM port is connected to a central processing unit (CPU) and the SAM port is connected to an external system such as a cathode ray tube or a video camera.

Recently, highly integrated video RAMs have been developed to further provide various additional functions and increased storage capacity in response to consumer needs.

To effectively provide a graphical interface between an user and a computer, high performance graphic system devices must be operated at correspondingly high frequencies. Accordingly, internal circuits of the video RAM should be operated in correspondence with a high speed system clock supplied from the graphic system. This depends upon whether data transferred through a data input/output line of the video RAM can keep pace with the system clock.

Generally, dual port memory devices for video RAMs include a RAM port for storing video data therein and a SAM port for outputting video data transferred from the RAM port.

FIG. 1 is a schematic block diagram illustrating one construction of a dual port memory device having a generally pipe-lined serial port.

In this device, RAM port 1 includes a memory cell array 11; a sense amplifier 13 for sensing and amplifying data stored in memory cells; a row decoder 12 and a column decoder 14 for selecting a row and a column of the memory cell array according to external addresses A0–An; a row address latch 16 and a column address latch 17 for inputting the external addresses A0–An thereto and respectively storing a row address and a column address therein by control of a RAM control logic 19; RAM I/O buffer 18 for inputting data to and outputting data from an external element; RAM I/O line 15 for interfacing between the memory cell array 11 and RAM I/O buffer 18; and RAM control logic 19 which receives external signals $\overline{RAS}$, $\overline{CAS}$, $\overline{WB/WE}$, DSF, and $\overline{DT/OE}$ to control general operations of RAM port 1.

As further shown in FIG. 1, SAM port 2 includes a data register 22 functioning as a serial access memory; a data transfer gate 21 for transferring data between the memory cell array 11 and the data register 22; SAM column decoder 23 for determining an access position within the data register 22; a serial counter 25 whose initial value is determined by an output value of the column address latch, and which is controlled by SAM control logic 27 to thereby control the SAM column decoder 23; SAM I/O buffer 26 for outputting SAM data to an external element and inputting SAM data from the external element; SAM I/O line 24 for connecting the data register 22 with the SAM I/O buffer 26; and SAM control logic 27, which is controlled by an external input serial clock SC, an external signal SE and the RAM control logic 19.

The video RAM having the above construction can be operated in a random access mode, a transfer mode and a serial access mode, the transfer mode and serial access mode being described in detail hereinbelow.

First, in the transfer mode, data corresponding to one row of the memory cell array 11 is sensed and amplified by the sense amplifier 13 and then transferred to and stored in the data register 22 through the data transfer gate 21. Then, in the serial read access mode, data obtained by decoding output of the serial counter 25 is retrieved from the data register 22 connected with the SAM I/O line 24 through the SAM column decoder 23, and is outputted through the SAM I/O buffer 26.

In this structure, the size of the data register 22 corresponds with the number of columns in memory cell array 11. Also, a column position to be accessed in the data register 22 is determined by serial counter 25, which is set with a column address (hereinafter referred to as a "TAP" address) during the transfer mode, the column address having been latched to the column address latch 17 of the RAM port 1.

FIG. 2 illustrates a detailed construction of the serial input/output functions of FIG. 1 and FIG. 3 is a timing diagram illustrating operation timing of the structure in FIG. 2. A construction and operation such as that illustrated in FIGS. 2 and 3 is disclosed in U.S. Pat. No. 5,042,014 (Title: "Dual Port Memory Having Pipelined Serial Output").

A dual port memory device having the pipelined serial port and the method of outputting serial data such as that shown in FIGS. 1, 2 and 3 will be briefly described below.

First, in the serial counter 25 shown in FIG. 2, LSB decoder 258 receives outputs from first and second T flip-flops 250 and 251 forming a ripple counter. Serial clock SC is inputted to an initial input terminal of the counter to thereby control asynchronous counting. Accordingly, LSB decoder 258 is synchronized with each rising edge of serial clock SC, and sequentially outputs signals PMX0–PMX3. Signal PMX3 and loading enable signal LDEN via inverter 244 are inputted to NAND gate 240, which thereby outputs the value obtained by negatively ANDing the signals PMX3 and LDEN.

Third to eighth T flip-flops 252 to 257 form subsequent ripple counters. The output value from NAND gate 240 is inputted to an input terminal T of the third T flip-flop 252, which serves as an initial counter. Through an inverter 241, the inverted output value from NAND gate 240 is inputted through a negative input terminal T_. Accordingly, as shown in FIG. 3, if the high state of the signal PMX3 is outputted from the LSB decoder 258 during a low state of the loading enable signal LDEN, the high state of the signal PMX3 is inputted to the input terminal T of the third T flip-flop 252. In other words, the high state of the input signal, corresponding to one period of the serial clock, is inputted to the input terminal T of the third T flip-flop 252, to control asynchronous counting in the third to eighth T flip-flops 252 to 257.

The output terminal of each of the third to eighth T flip-flops 252 to 257 is connected to a predecoder 230, which thereby inputs an asynchronous count value. Serial decoder 220 then decodes an input signal obtained from predecoder 230, and thereby selects 4 bits of data from data register 22 for output to latch 247.

The first to eighth T flip-flops 250 to 257 are enabled by the loading enable signal LDEN, and column addresses (TAP) CA0 to CA7 of the data register 22 are respectively inputted to a preset terminal of each of the first to eighth T flip-flops 250 to 257, thereby to designate the transfer starting address. The output of the predecoder 230 is determined by the asynchronous count value output from third to eighth T flip-flops 252 to 257.

On the other hand, in RS flip-flop 259, the PMX0 signal is inputted to a set input terminal S, and the result which is obtained by logically ORing the signal PMX2 with the result value obtained by logically ANDing the signal PMX3 with the load enable signal LDEN is inputted to a reset input terminal R. One side pass transistor 246 of the transfer gate is switched and controlled by an output signal of the RS flip-flop 259.

Finally, a 4-1 multiplexer 248 is output-controlled by the signals PMX0 to PMX3 outputted from the LSB decoder 258, and the latest 4 bits of input data corresponding to the signals PMX0 to PMX3 is sequentially outputted from output terminal SDQ one bit at a time.

In the above description, the load enable signal LDEN is a "high" active signal which sets the column addresses CA0 to CA7 to the serial counter 25. In the following, the case that the load enable signal LDEN is in a "low" state will be described.

As shown in FIG. 3, if the high state of the signal PMX2 is generated and outputted from the LSB decoder 258, the RS flip-flop 259 outputs the low state of the signal as shown by the $Q_{259}$ wave form. Accordingly, the low signal outputted from the RS flip-flop 259 is inputted to one side pass transistor 246 of the transfer gate, to thereby turn off the one side pass transistor 246. As a result, path between the data register 22 and the latch 247 is cut off, to prevent latched data from being damaged.

As further shown in FIG. 3, if the high signal PMX3 is generated and outputted from the LSB decoder 258 so that the high signal PMX3 is inputted to the third T flip-flop 252 via the NAND gate 240 and the inverter 241, the counting state of the third to eighth T flip-flops 252 to 257 is changed and 4 new bits of data are outputted from the data register 22 and inputted to the latch 247 by the predecoder 230 and the serial decoder 220. If the state of the signal PMX0 is changed into the high state, the "high" signal outputted from the RS flip-flop 259 is inputted to the one side pass transistor 246 to thereby turn on the one side pass transistor 246, so that data outputted from the data register 22 can be updated to the latch 247.

In other words, in the conventional dual port memory device, a state of the serial decoder 220 is varied once every four cycles of the serial clock SC before one cycle of output data, to reduce the data output time resulting from decoding data. And, when a new column address (TAP) CA0 to CA7 is inputted to the serial counter 25 (that is, the loading enable signal LDEN is in the high state), or when new column addresses CA0 to CA7 generate the high state of the signal PMX3, the serial counter 25 inputs the load enable signal LDEN to one side of the NAND gate 240 via the inverter 244 to thereby cause the output of NAND gate 240 be in the high state, in order to prevent erroneous column address from being inputted to the predecoder 230.

The conventional dual port memory device having the pipe-lined serial port and the conventional method for outputting serial data described above has the following problems.

To ensure continuity of serial data, after new data is transferred to the data register 22 during the transfer mode, the start column address (TAP) of the data register 22 is applied to the serial counter 25. However, as shown in FIG. 4, a time T1 is required for a decoding stage (that is, the third to eighth T flip-flops 252 to 257) when the serial counter 25 determines the values of the start column addresses. A delay time T2 is further required during which the output of the decoding stage is processed in the predecoder 230. Next, a time T3 is required during which the output of the predecoder 230 is processed in the serial decoder 220. And finally, a time T4 is required during which an output of the data register 22 selected by the serial decoder 220 is loaded into the latch 247. After these time periods have elapsed, the first rising edge of the serial clock SC is caused for outputting new serial data.

In other words, to obtain output data corresponding to column address TAP, the rise of the serial clock SC (of the start column address TAP) should be delayed at least after the time T has elapsed. If the load enable signal LDEN transitions to the high state between cycles of the serial clock SC, the serial access time of the data for start column address TAP is further increased, otherwise failure in obtaining data corresponding to start column address TAP is caused. Therefore, to prevent the above problem, a serial access time of the serial clock SC is necessarily increased.

Also, during a mid-line load cycle (that is, a real-time read transfer cycle, hereinafter referred to as an "RRT cycle") of the video RAM, the lapsed time T further includes the transfer time to the data register 22, and this total further limits the serial access time.

In addition to the above problems, when a ripple counter such as that in serial counter 25 is utilized, a time required for an output of the serial counter in response to a cycle of the serial clock SC to reach the final stage, corresponds to a time obtained by multiplying the delay time td of each stage by the total number of stages. This delay causes problems when attempting serial output at high serial clock frequencies over 50 MHz, even though the decoding output time of the serial decoder 25 precedes by one cycle the output timing of the 4-1 multiplexer.

And finally, in the above conventional pipe-lined serial output structure, the number of transfer lines (that is, SAM I/O lines) connecting the data register 22 with both side pass transistors 245 and 246 of the transfer gate depends on the number of bits per column required. Because the transfer lines are situated in a core side of the memory layout construction, this causes a disadvantage by increasing the total area required by the memory chip.

SUMMARY OF THE INVENTION

Accordingly, it is an object of the present invention to provide a dual port memory device and method which outputs serial data at high speeds from a data register.

It is another object of the present invention to provide a dual port memory device for outputting data at a high speed which is capable of preventing output errors during a real-time read transfer operation.

It is a further object of the present invention to provide a dual port memory device which reduces the number of transfer lines required for outputting serial data, thereby reducing the entire area of a memory chip.

It is a still further object of the present invention to provide a dual port memory device and method which eliminates delays caused by setting up a serial counter with a starting column address, to thereby perform serial access timing at a high speed.

In order to accomplish these and other objects, the present invention provides a dual port memory device and method for outputting serial data at a high speed from a memory array through a data register. The device comprises a RAM port and a SAM port. The SAM port receives start column address data from the RAM port during a transfer cycle and the data register is filled with row data from a designated row. During this process, the start column address is latched and incremented, then the incremented address is loaded into a serial counter as an initial address to set up a pipeline serial output. After completion of the transfer cycle, the serial counter is controlled by a serial clock and causes column data to be prefetched from the data register and supplied to an output buffer for serial output. Because of the pipeline configuration and the use of RAM data for start column address data, data is accessed and serially output at a high speed and delays are eliminated.

BRIEF DESCRIPTION OF THE DRAWINGS

A detailed description of the present invention will be made with reference to the attached drawings, in which like numbers indicate the same or similar elements, and in which:

FIG. 16 is a view illustrating a detailed circuit diagram of a generator for a signal ROT for controlling an SAM I/O buffer according to one preferred embodiment of the present invention;

FIG. 17 is a view illustrating a detailed circuit diagram of a generator for a data transfer pulse DTP and a loading enable signal LDEN;

DETAILED DESCRIPTION OF THE PREFERRED EMBODIMENT

Figure 1:
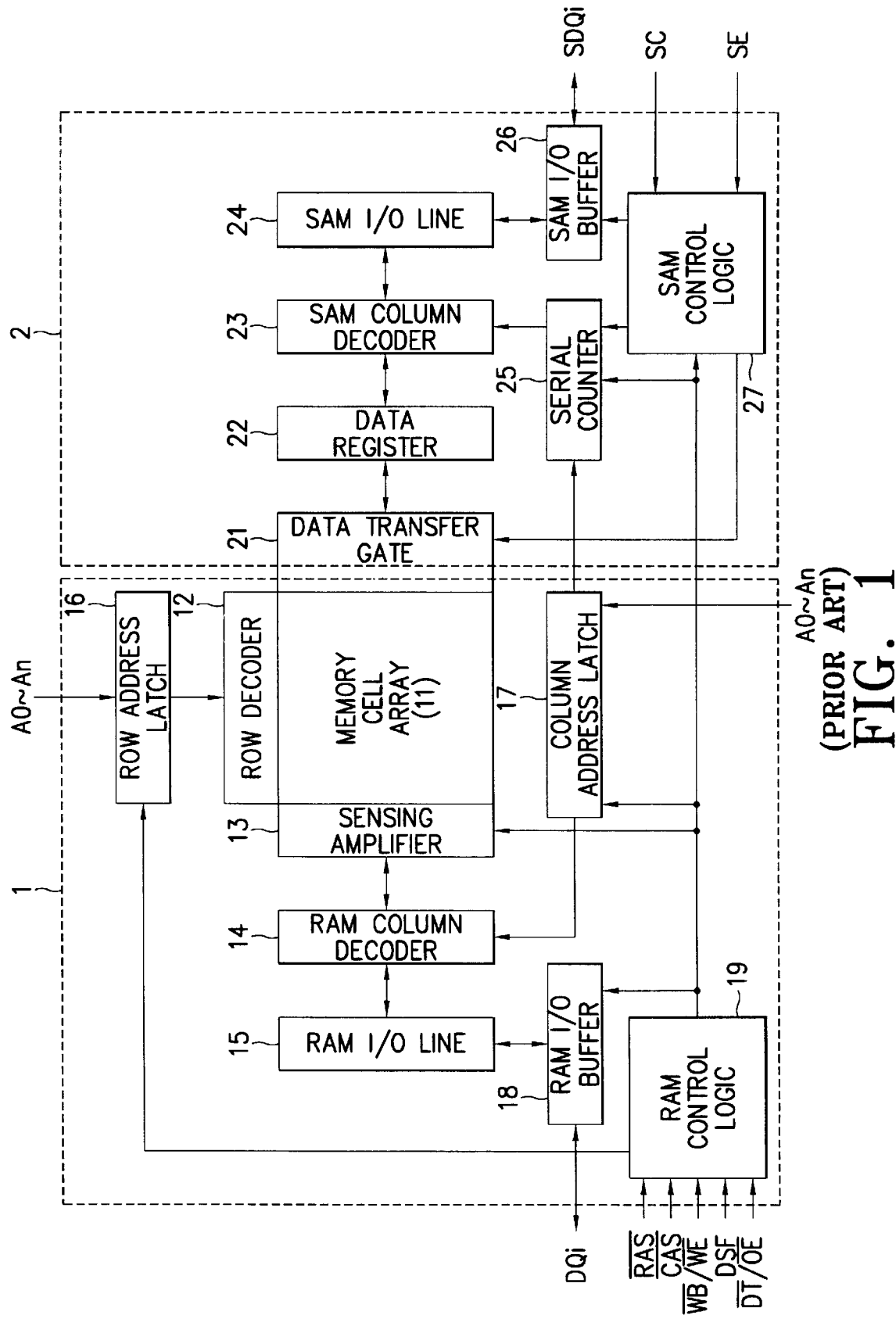
FIG. 1 is a block diagram illustrating a construction of a conventional dual port memory device.
Figure 2:
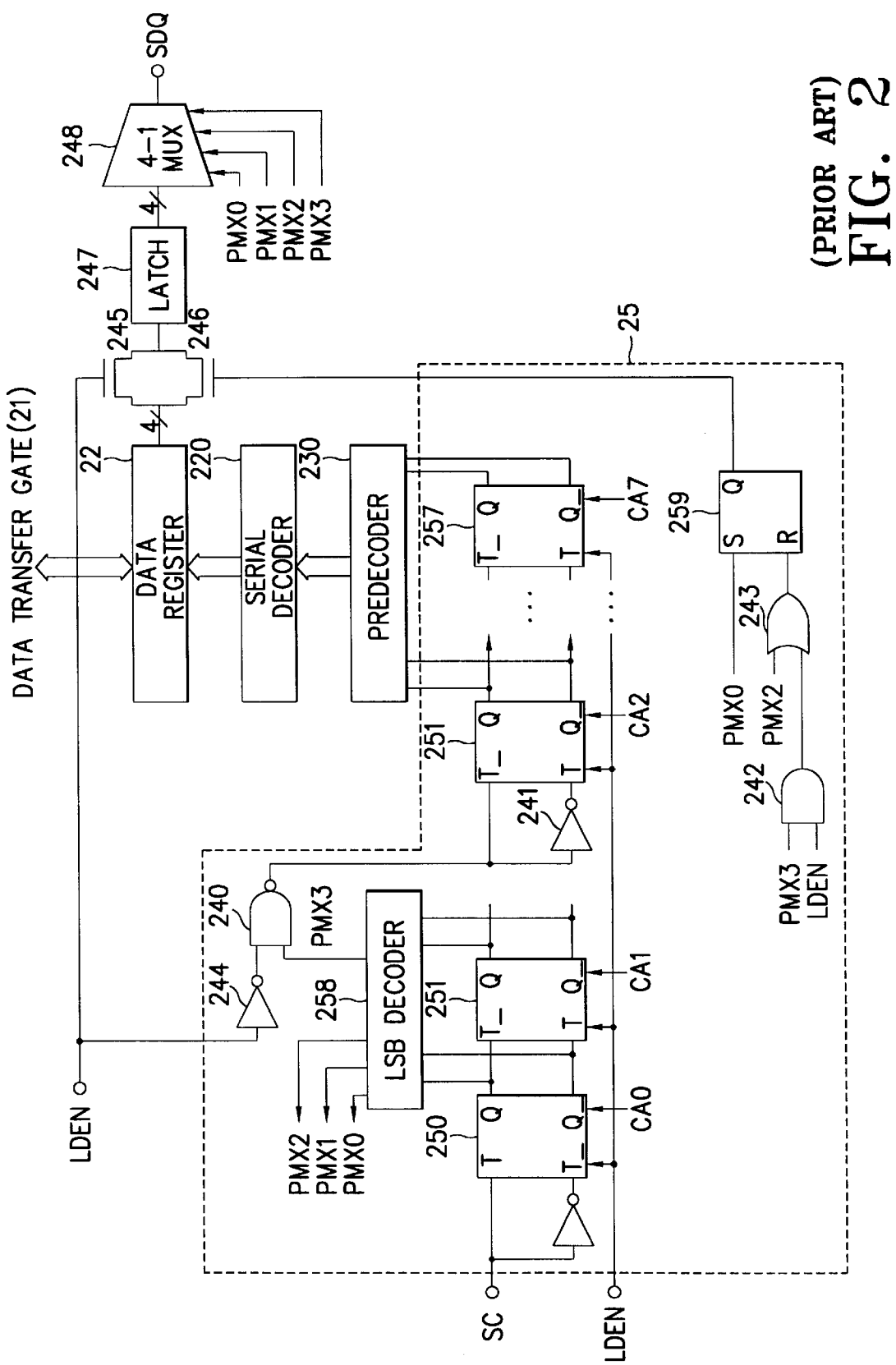
FIG. 2 is a view illustrating a detailed serial input/output construction according to the device of FIG. 1.
Figure 3:
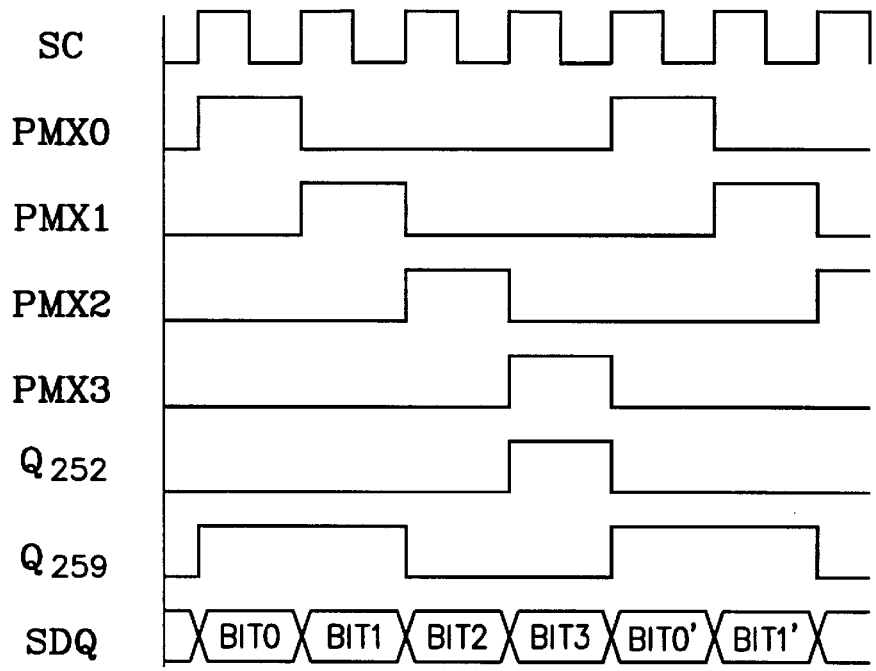
FIG. 3 is a timing diagram illustrating operation timing of the construction of FIG. 2.
Figure 4:
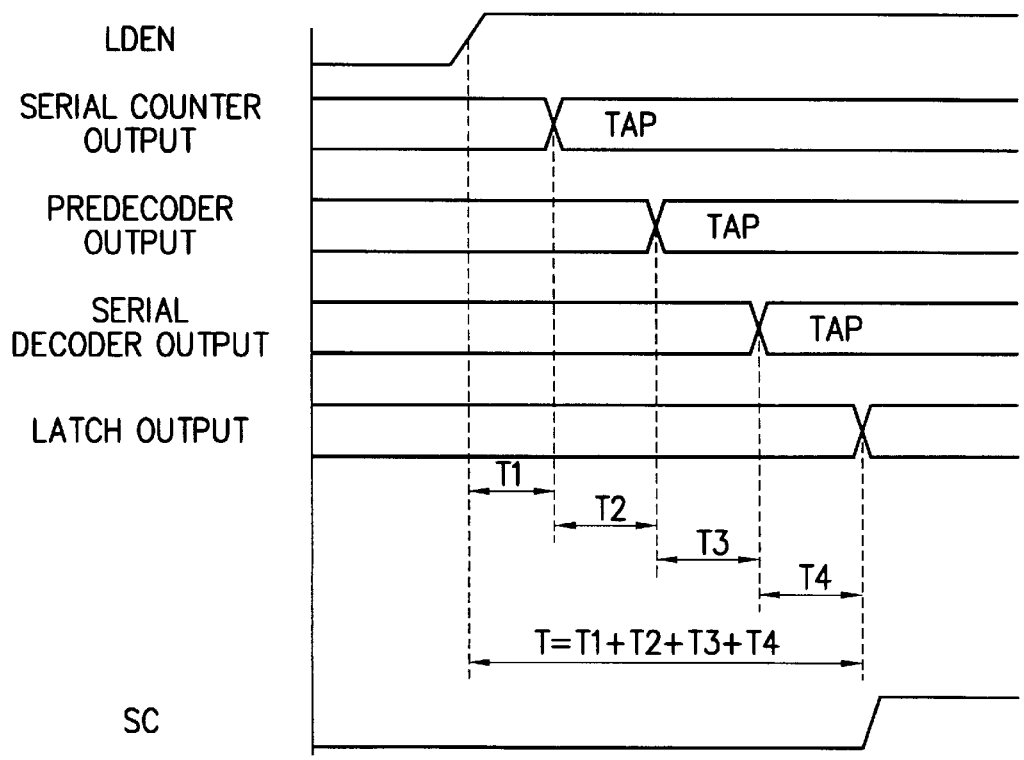
FIG. 4 is a timing diagram illustrating delay problems caused by a conventional pipe-lined dual port memory device having the constructions of FIGS. 1 and 2.
Figure 5:
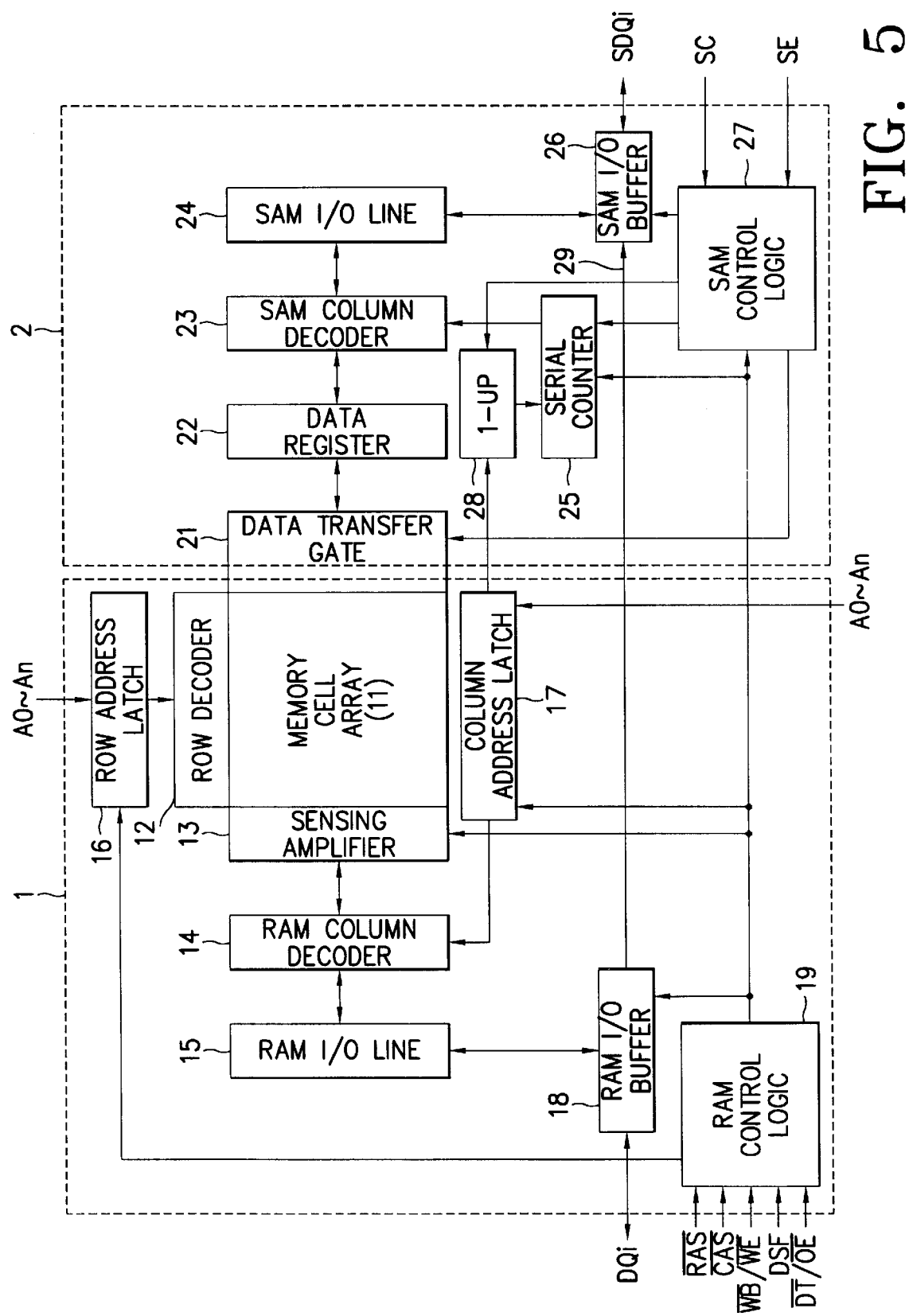
FIG. 5 is a block diagram illustrating a construction of a dual port memory device according to one preferred embodiment of the present invention.

As shown in FIG. 5, a RAM port 1 of a dual port memory device according to one preferred embodiment of the present invention includes a memory cell array 11; a sense amplifier 13 for sensing and amplifying data of a designated memory cell; a row decoder 12 and a column decoder 14 for selecting a row and a column of the memory cell array 11 according to external addresses A0 to An; a row address latch 16 and a column address latch 17 for inputting the external addresses A0 to An thereto and storing row and column addresses therein under control of RAM control logic 19; RAM I/O buffer 18 for inputting data to and outputting data from external elements; an RAM I/O line 15 for interfacing between the memory cell array 11 and the RAM I/O buffer 18; and RAM control logic 19 for controlling all operations of the RAM port 1, the RAM control logic 19 inputting and being controlled by external signals $\overline{RAS}$, $\overline{CAS}$,$\overline{WB}$,$\overline{DSF}$, $\overline{DT/OE}$.

As further shown in FIG. 5, SAM port 2 includes a data register 22 serving as a serial access memory; a data transfer gate 21 for transferring data between the memory cell array 11 and the data register 22; SAM column decoder 23 for determining an access position of the data register 22; 1-up 28 for incrementing a start column address TAP by an address value corresponding to one column, the start column address being outputted from the column address latch 17 under the control of the SAM control logic 27, and the added start column address TAP+1 being outputted therefrom; a serial counter 25 for controlling the SAM column decoder 23 by synchronizing with a serial clock SC to thereby perform a counting operation, an initial counting value of the serial counter 25 being determined by the start column address TAP+1; SAM I/O buffer 26 for inputting SAM data thereto and outputting SAM data therefrom; SAM I/O line 24 for connecting the data register 22 with the SAM I/O buffer 26; and SAM control logic 27 being controlled by external input serial clock SC, external input serial enable signal SE and RAM control logic 19. A path 29 is further included, through which output of the RAM I/O buffer 18 of the RAM port 1 is inputted to the SAM I/O buffer 26 of the SAM port 2, differently from the conventional dual port memory device.

A serial data output operation of the dual port memory device shown in FIG. 5 will be herein described according to one preferred embodiment of the present invention.

First, the start column address TAP for accessing of the data register 22 is determined by a column address inputted through address input terminals A0 to An of the RAM port 1 during the transfer cycle.

In general, the RAM port 1 and the SAM port 2 are synchronized to each other during the transfer cycle.

Therefore, input to and output from RAM port 1 are inhibited. However, data from the memory cell array 11 may still be sensed and amplified through sense amplifier 13 for transfer to SAM port 2. Also, the start column address TAP, which is received from an external source, is latched into the column address latch 17, and TAP data is delivered to the RAM I/O buffer 18 via the RAM column decoder 14 and the RAM I/O line 15.

The start column address TAP data stored in the RAM I/O buffer 18 is then stored through the path 29 in the SAM I/O buffer 26, and then outputted via an output terminal SDQi by the SAM control logic 27.

As set forth in the above, data for the start column address TAP within data register 22 does not need to be accessed since the start column address TAP is utilized from the data supplied by RAM port 1 during the transfer cycle. Therefore, the incremented column address TAP+1 outputted from the 1-up 28 is inputted to the serial counter 25. While data of the start column address TAP is being output through the output terminal SDQi, data of the incremented start column address TAP+1 from data register 22 is accessed and then stored in the SAM I/O buffer 26.

In other words, access of data corresponding to the start column address TAP from the data register 22 is not performed, which is different from the conventional manner. Rather, this data is sensed in the RAM port 1 during the transfer cycle and is utilized by the SAM port through the newly provided path 29, thereby solving the problem in which high speed serial access is limited by the delays caused by accessing data of the start column address TAP.

Also, since the incremented start column address TAP+1 is applied to serial counter 25 instead of the start column address TAP, addresses to access data to be output from data register 22 are generated immediately, thereby enabling high speed serial access.

Figure 6:
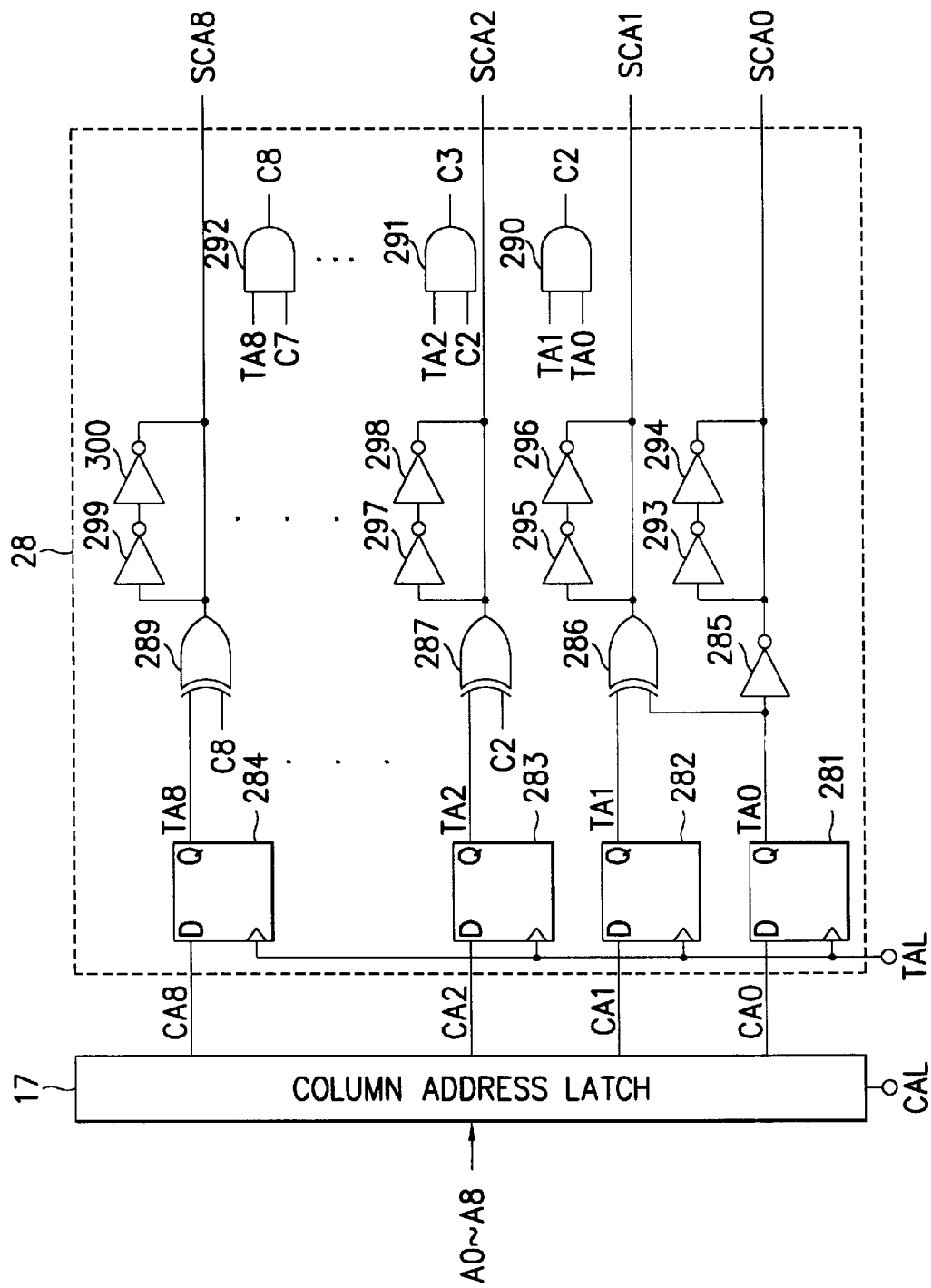
FIG. 6 is a view illustrating a detailed circuit diagram of the 1-up 28 of FIG. 5.

FIG. 6 is a view illustrating a detailed circuit diagram of 1-up 28 connected with the column address latch 17 of FIG. 5.

The 1-up 28 of the FIG. 6 responds to a TAP address load signal TAL, to thereby receive the column addresses CA0 to CA8 from the column address latch 17. As a result, the 1-up 28 applies the added column addresses SCA0 to SCA8 to the serial counter 25. The 1-up 28 includes D flip-flops 281 to 284 for responding to the TAP address load signal being in the logic "high" state, to thereby latch-output the column addresses CA0 to CA8; an inverter 285 for performing a 1-up operation; exclusive OR gates 286, 287 and 289 (hereinafter referred to as "X-OR gates"); carry generating AND gates 290 to 292; and latch stages 293 to 300 for latching output of each stages.

Figure 7:
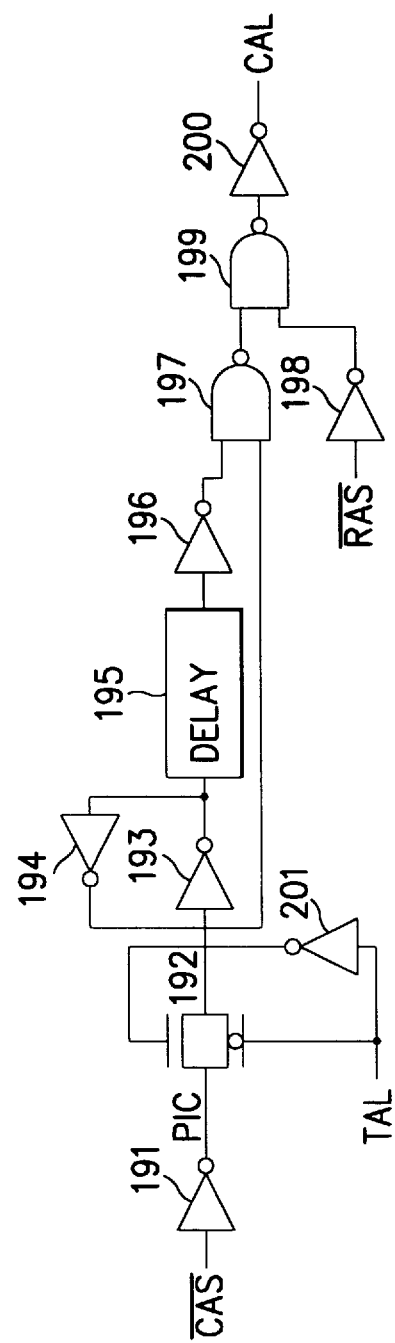
FIG. 7 is a view illustrating a detailed circuit diagram of a generator for a column address latch control signal (CAL) according to one preferred embodiment of the present invention.

Addresses A0 to A8 are inputted to the column address latch 17 through an address input terminal when the column address latch control signal CAL is in the logic "high" state. And, when the column address latch control signal CAL is in the logic "low" state, the column addresses are latched in the column address latch 17. FIG. 7 is a view illustrating a detailed circuit diagram of a generator for a column address latch control signal (CAL) which controls the column address latch 17.

The output state of the column address latch control signal CAL when the TAP address load signal TAL is in the logic "low" state will be described with reference to FIG. 7.

When a row address strobe $\overline{RAS}$ and a column address strobe $\overline{CAS}$ are all in the logic "high" state (generally, called a "precharge" state), the column address latch control signal CAL of the low state is outputted. Also, if the row address strobe $\overline{RAS}$ becomes the low state, the low state of the row address strobe (hereinafter referred to as "PIR"), which is inverted through an inverter 198, becomes the high state. At this time, when the column address strobe is in the high state, since the signal PIC via an inverter 191 is in the low state, the high state of the NAND gate 197 is outputted. Accordingly, the column address latch control signal CAL is generated from the low state to the high state through an NAND gate 199 and an inverter 200, and the addresses A0 to A8 are inputted to the column address latch 17.

When the row address strobe $\overline{RAS}$ is in the logic low state, if the column address strobe $\overline{CAS}$ of the low state is inputted within a constant time therefrom (generally, the constant time is predetermined in the video RAM and the dynamic RAM, tRCD denoting the delay time between the $\overline{RAS}$ and the $\overline{CAS}$), the signal PIC is in the logic high state. And, if the signal PIC is inputted to an NAND gate 197 through an inverter 193, a delay 195 and an inverter 196, the low state of the signal is outputted from the NAND gate 197 and the column address latch control signal CAL is transited from the high state to the low state. Accordingly, the column address latch 17 latches the addresses A0 to A8, thereby to output the latched addresses A0 to A8 as the column addresses CA0 to CA8. In the above described FIG. 7, the delay 195 is an element for controlling a column address set-up and hold time.

Figure 8:
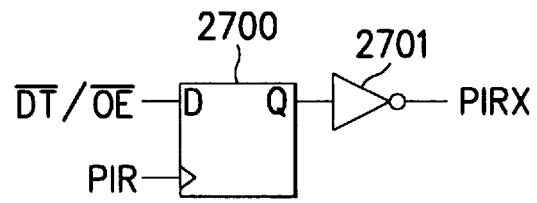
FIG. 8 is a view illustrating a detailed circuit diagram of a generator for a signal PIRX according to one preferred embodiment of the present invention.
Figure 9:
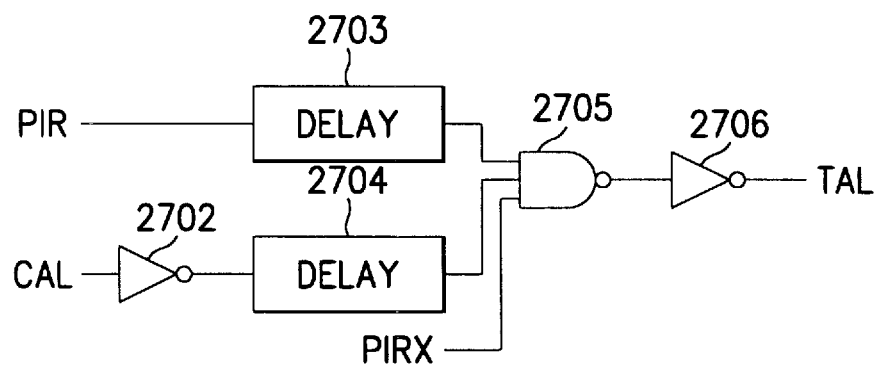
FIG. 9 is a view illustrating a detailed circuit diagram of a generator for TAP address latch signal (TAL) according to one preferred embodiment of the present invention.

FIG. 8 is a detailed circuit diagram illustrating a generator for a signal PIRX, and FIG. 9 is a detailed circuit diagram which illustrates a generator for a TAP address latch signal (TAL).

In FIG. 8, the signal PIRX is generated in the high state during a transfer mode. When the row address strobe $\overline{RAS}$ is activated to the low state, the signal PIR latches the states of the data transfer and output enable signal $\overline{DT/OE}$, so that the signal PIRX is outputted through an inverter 2701. In other words, when the row address strobe $\overline{RAS}$ is activated to the low state, if the data transfer and output enable signal $\overline{DT/OE}$ is in the low state, the low state of the PIR is changed into the high state by the low state of the address strobe $\overline{RAS}$. Further, the low state of the data transfer and output enable signal $\overline{DT/OE}$ is inputted to the D flip-flop 2700, and the signal PIRX is transited from the low state to the high state through an inverter 2701.

When the row address strobe $\overline{RAS}$ is activated to the low state, if the data transfer and output enable signal $\overline{DT/OE}$ is in the high state, the signal PIRX goes to the low state, which thereby designates that the device is no longer in the transfer mode.

In FIG. 9, since the TAP address load signal TAL does not need to be generated during the non-transfer mode, the NAND gate 2705 is controlled by the signal PIRX. In FIG. 9, the TAP address load signal TAL is outputted through an inverter 2706 and a NAND gate 2705, which inputs the signal PIR via a delay 2703, the column address latch control signal CAL via an inverter 2702 and a delay 2704 and the signal PIRX. The delay 2703 is an element for generating the TAP address load signal TAL after TAP data from the memory cell array 11 is fully amplified by the sense amplifier 13. And, the delay 2703 suppresses PIR to allow generation of a data transfer pulse (hereinafter referred to as a "DTP" and to be described in the following), which is controlled by the TAP address load signal TAL in the transfer cycle having a short tRCD condition.

Also, after a valid column address is latched (after the high state of the column address latch control signal CAL is converted to the low state), the delay 2704 is an element for generating the TAP address load signal TAL, which causes the valid column address TAP to be inputted by the 1-up 28.

As set forth in the above, the low state of the TAP address load signal TAL is maintained during the non-transfer mode (the signal PIRX is in the low state), so that the previous column address TAP is stored in the 1-up 28. The high state of the TAP address load signal TAL is generated to cause the valid column address TAP to be stored in the column address latch 17 in the transfer mode (the signal PIRX is in the high state) and to input and latch new column address TAP to the 1-up 28. Furthermore, when the above described TAP address load signal TAL is generated in the high state, the signal PIC is cut off by the transfer gate 192 as shown in FIG. 7.

Since the RAM operations of a general video RAM are identical with that of the dynamic RAM, the column address latch 17 should perform toggling the column address control signal CAL for a page mode read/write operation, so that a new column address is inputted to the column address latch 17 at the time of toggling of the column address strobe $\overline{CAS}$.

However, at the time of toggling the column address strobe $\overline{CAS}$ in the transfer cycle, the only valid column address in the falling edge of the first column address strobe $\overline{CAS}$ is the start column address TAP. The rest of the column address is invalid. Accordingly, to prevent erroneous operations with the invalid column address, the transfer gate 192 responds to generation of the high state of the TAP address load signal TAL, to cut off transfer of the signal PIC, as shown in FIG. 7.

Figure 10:
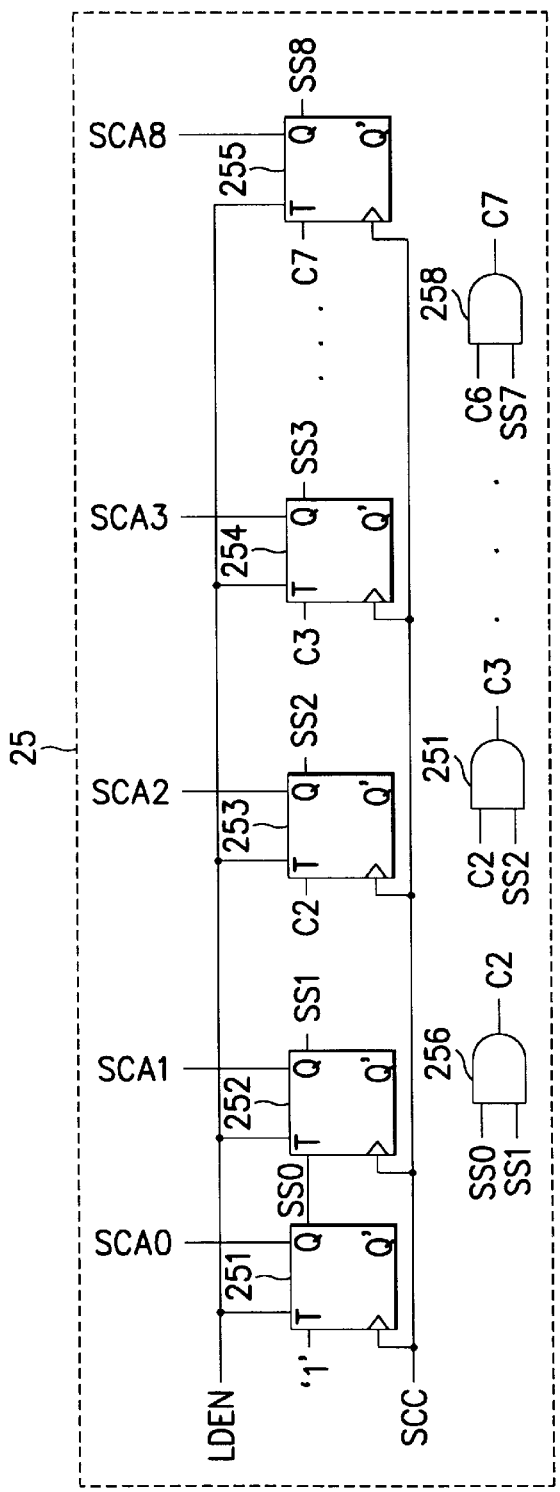
FIG. 10 is a view illustrating a detailed circuit diagram of a synchronous serial counter 25 of a construction of FIG. 5 according to one preferred embodiment of the present invention.

FIG. 10 is a detailed circuit diagram of a synchronous serial counter 25 of a construction of FIG. 5 according to one preferred embodiment of the present invention. Each stage of the serial counter 25 is constructed with T flip-flops 251 to 255 which can be preset. Serial counter 25 is a synchronous counter which is synchronized to the serial counting clock SCC, which is further synchronized to the external serial clock SC, to thereby perform the counting operation.

An initial value of the serial counter 25 is determined by output addresses SCAi (i=0 to 8) of the 1-up 28, which are inputted when the loading enable signal LDEN is in the high state. As known from the above description, the output addresses SCAi are the output addresses of the 1-up 28 illustrated in FIG. 6, and correspond to the incremented column address TAP+1. The serial counter 25 is synchronized with the falling edge of the serial counting clock SCC after the initial value thereof is set, and AND gates 256, 257 and 258 of the serial counter 25 are carry generating elements.

Figure 11:
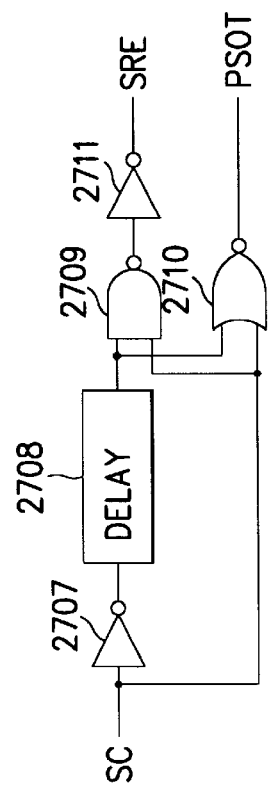
FIG. 11 is a view illustrating a detailed circuit diagram of a generator for signals SRE and PSOT according to one preferred embodiment of the present invention.
Figure 12:
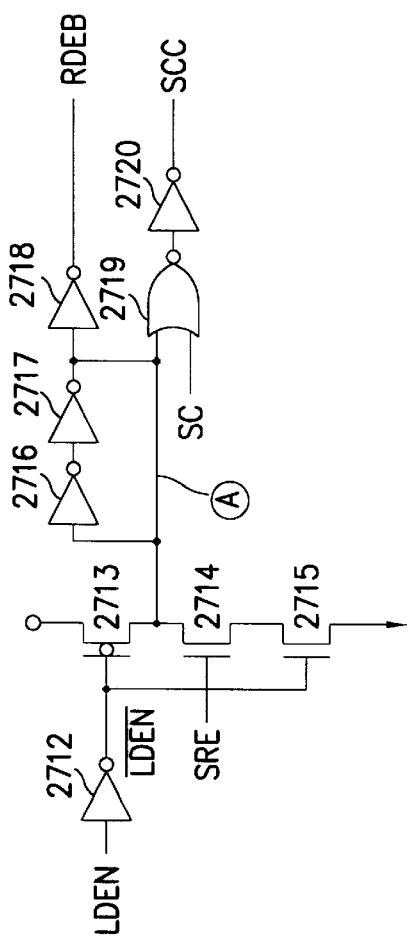
FIG. 12 is a view illustrating a detailed circuit diagram of a generator for a serial counting clock SCC according to one preferred embodiment of the present invention.

FIG. 11 is a detailed circuit diagram of a generator for signals SRE and PSOT, and FIG. 12 is a detailed circuit diagram of a generator for a serial counting clock SCC.

In FIG. 11, if the serial clock SC as an external signal is in the low state, the signal SRE output from inverter 2711 is outputted in the low state and the signal PSOT output from NOR gate 2710 is outputted in the low state. If the serial clock SC goes to the high state, the NAND gate 2709 receives the high state input signals delayed by delay 2708, to thereby output the low state signal. And the signal SRE output by the inverter 2711 goes to the high state. Accordingly, if the high state output signal of the serial clock SC passes through the delay 2708, the high and low state signal are inputted to the input terminal of the NAND gate 2709, so that the signal SRE output by the inverter 2711 goes to the low state. The signal SRE is a pulse which is generated in the high-going edge of the serial clock SC, and the delay 2708 is an element for determining a pulse width of the signal SRE.

Also, if the high state of the serial clock SC is changed to the low state, the output signal of the delay 2708 is continuously maintained as the low state by the delay, so that the output signal PSOT of the NOR gate goes the high state. And then, if the low state of the serial clock is changed into the high state through the inverter 2707 and then inputted to the NOR gate 2710 via the delay 2708, the output signal PSOT of the NOR gate 2710 goes to the low state. The above described signal PSOT is a pulse which is generated in a low-going edge of the serial clock SC, and the delay 2708 is an element for determining the pulse width of the signal PSOT.

The generator for the serial counting clock SCC will be described in detail below with reference to FIG. 11.

If the load enable signal LDEN goes to the low state during the initial operation of the dual port memory device, and the signal SRE is generated in the high pulse state by the high-going edge of the serial clock SC, a charge state of a node A is discharged to ground state Vss through NMOS transistors 2714 and 2715, thereby to go to the low state. Then the low state of the node A is stored by the latches 2716 and 2717. The high state of an RAM data enable signal RDEB is maintained by the inverter 2718, and the serial counting clock SCC having the same phase as that of the serial clock SC is generated through the NOR gate 2719 and the inverter 2720.

If the load enable signal is generated in the high state (that is, if the incremented column address TAP+1 is loaded into the serial counter 25 during the transfer cycle), the inverter 2712 outputs the low state of the load enable signal and a PMOS transistor 2713 is turned on, thereby to charge the node A to the high state. At this time, the NMOS 2715 is turned off and a direct current path is cut off irrespective of the switching operation of the NMOS transistor 2714. If the node A goes to the high state, the RAM data enable signal RDEB goes to the low state, and the high state of the serial counting clock SCC is outputted irrespective of the serial clock.

When the incremented column address TAP+1 is loaded into the serial counter 25 at the time of the high state of the load enable signal LDEN, the serial counting clock SCC is inhibited by the serial clock SC, which prevents the incremented column address TAP+1 from being misloaded into the serial counter 25.

In general video RAM devices, since the load enable signal LDEN is operated as a pulse (to enable the counting operation), the load enable signal LDEN again goes to the low state in a constant time (that is, a time for setting the valid address to the serial counter 25). After the load enable signal LDEN goes to the low state, if the high-going edge of the serial clock SC is inputted, the high pulse state of the signal SRE is generated, and the node A is discharged through the NMOS transistors 2714 and 2715 to thereby go to the low state. The serial counting clock SCC is toggled according to the serial clock SC, to thereby drive the serial counter 25.

Figure 13:
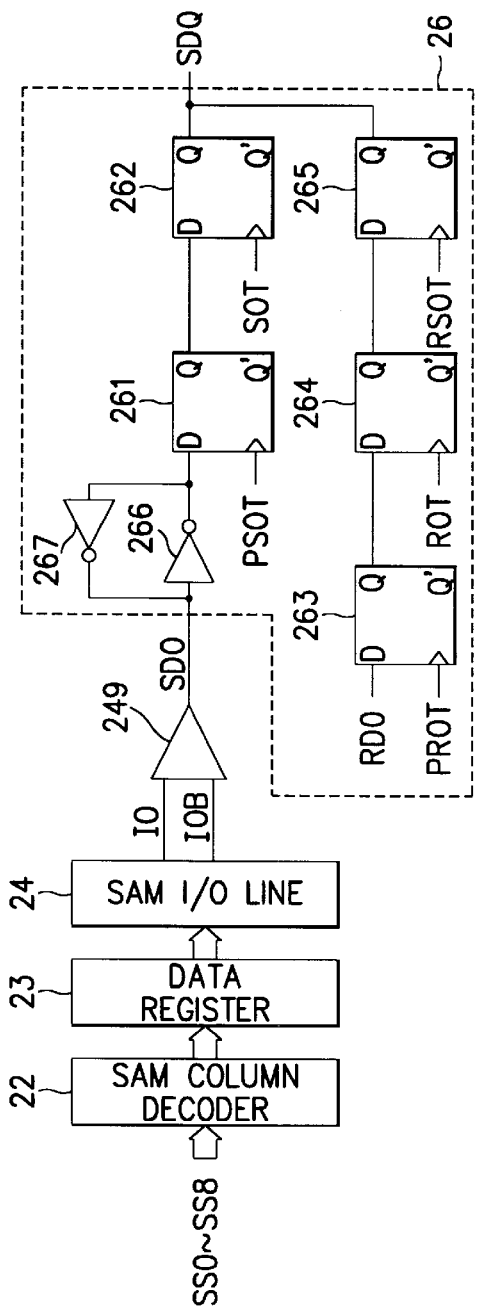
FIG. 13 is a view illustrating a detailed circuit diagram of a SAM I/O buffer 26 of a construction of FIG. 5 according to one preferred embodiment of the present invention.

FIG. 13 is a detailed circuit diagram illustrating SAM I/O buffer 26 of a construction of FIG. 5 according to one preferred embodiment of the present invention. As shown in FIG. 13, the SAM I/O buffer 26 includes latches 266 and 267 for storing therein data of the data register 22 which is amplified through the I/O sense amplifier 249; D flip-flops 261 and 262 for serially outputting data from the SAM port (hereinafter referred to as "SDO"); and D flip-flops 263, 264, and 265 for serially outputting data from the RAM port (hereinafter referred to as "RDO"). In the present invention, the data RDO is output data corresponding to the start column address TAP and the data RDO comes from the RAM port, via the RAM I/O buffer 18 through the path 29. The SAM I/O buffer 26 is operated in the pipelined manner.

Figure 14:
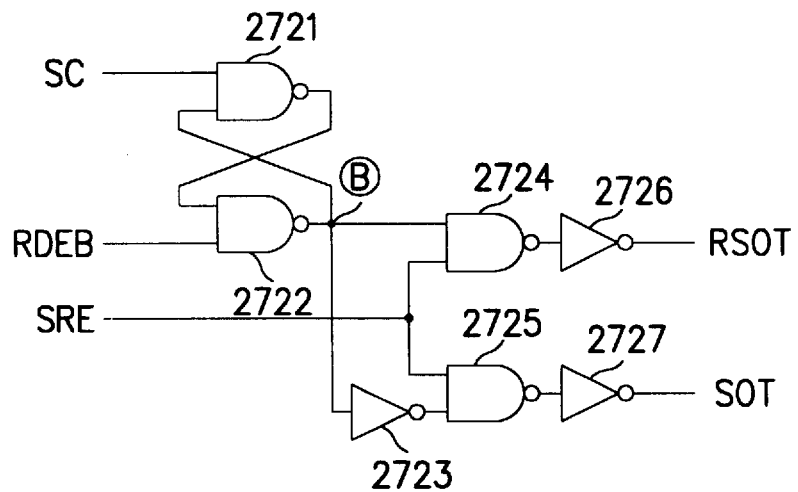
FIG. 14 is a view illustrating a detailed circuit diagram of a generator for signals RSOT and SOT for controlling an SAM I/O buffer according to one preferred embodiment of the present invention.
Figure 15:
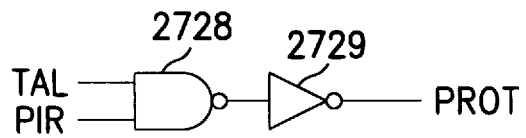
FIG. 15 is a view illustrating a detailed circuit diagram of a generator for a signal PROT for controlling an SAM I/O buffer according to one preferred embodiment of the present invention.

FIGS. 14 to 16 illustrate detailed circuit diagrams of generators for signals RSOT, SOT, PROT and ROT for controlling the SAM I/O buffer 26 according to one preferred embodiment of the present invention.

FIG. 14 illustrates a generator of a control signal for controlling the D flip-flops 262 and 265 for the SDQi output as shown in the above described FIG. 13. In FIG. 14, it is determined according to the state of the node B whether data outputted from the data register 22 is inputted to the SDQi, or whether data (the TAP data) outputted from the RAM port is inputted to the SDQi. In other words, if the node B is in the low state, the high pulse state of the signal SOT is generated by the signal SRE, thereby to output data SDO of the SAM I/O buffer 26 through SDQi, and if the node B is in the high state, the high pulse state of the signal RSOT is generated by the signal SRE, so that the SAM I/O buffer 26 outputs data RDO as TAP data from the RAM port 1 through the SDQi.

The state of the node B is determined by the RS flip-flops 2721 and 2722. In other words, the RAM data enable signal RDEB is inputted to a set input terminal of the RS flip-flop, and as shown in FIG. 12, if the RAM data enable signal RDEB goes to the low state, after the load enable signal LDEN goes the high state, the node B goes to the high state. And, because the serial clock SC is inputted to the reset input terminal of the RS flip-flop, after the RAM data enable signal RDEB goes to the high state, if the serial clock SC is in the low state, the node B goes to the low state. The signal PSOT generated in FIG. 11 is inputted to a clock terminal of the D flip-flop 261 of the SAM I/O buffer 26, to thereby control the operation of the D flip-flop 261. As set forth in the above, the signal PSOT is a high pulse which is generated in the low-going edge of the serial clock SC. In other words, the signal PSOT is generated in the low-going edge of the serial clock SC, thereby to latch data SDO which is stored in the latches 266 and 267, into the D flip-flop 261.

As set forth in the above, the D flip-flops 261 and 262 of the SAM I/O buffer 26 form the paths for all SAM data output except the TAP data output, and performs the pipe line operation for fetching the output data in the low-going edge of the serial clock SC and transmitting the output data to the SDQi in the high-going edge of the serial clock SC. The TAP data RDO outputted from the RAM port 1 is stored in the D flip-flop 263 when the signal PROT is in the high state.

FIG. 15 is a detailed circuit diagram of a generator for a signal PROT for controlling the latch operation of the D flip-flop 263 of the SAM I/O buffer 26 according to one preferred embodiment of the present invention. Since data RDO is connected to the RAM I/O buffer 18 of the RAM port 1, the signal PROT is controlled by the TAP address load signal TAL which is generated only in the transfer cycle, in order to sense data RDO as the TAP data (in the transfer cycle) and to store the sensed TAP data RDO. Also, since a constant time is needed for the valid TAP data to exist in data RDO from the memory cell array 11, the valid TAP data is controlled by the TAP address load signal TAL.

Since data RDO can be precharged in a constant state in a precharge section of the row address strobe $\overline{RAS}$, in order to reduce the access time of the RAM port 1, if the signal PIR is in the low state, the low state of the signal PROT is maintained, thereby to suppress latching data RDO during its precharge state represented by the precharge section of the row address strobe $\overline{RAS}$.

The TAP address data RDO stored in the D flip-flop 263 is transmitted to the next D flip-flop 264 by the signal ROT. FIG. 16 illustrates one example of the generator for generating the signal ROT.

In FIG. 16, a data transfer pulse DTP is a high pulse for controlling the on/off switching of the data transfer gate 21, thereby to connect the memory cell array 11 with the data register 22. Accordingly, the signal ROT should be generated following the data transfer pulse DTP.

As set forth in the above, the D flip-flops 263 and 264 of the SAM I/O buffer 26 form the output path of TAP data, and perform the pipe line operation for fetching TAP data after the TAP address load signal TAL is generated and the valid TAP data exists on data RDO. In other words, the SAM I/O buffer 26 fetches TAP data after data is transferred from the memory cell array 11 to the data register 22, and outputs TAP data through the SDQi in the high-going edge of the first serial clock SC for outputting TAP data.

FIG. 17 is a detailed circuit diagram of the generator for the data transfer pulse DTP and the loading enable signal LDEN according to one preferred embodiment of the present invention.

If the row address strobe $\overline{RAS}$ is activated to the low state, the signal PIR is transited from the low state to the high state, and the low pulse is outputted from the OR gate 2734. In FIG. 17, the delay 2733 determines the pulse width of signal PIR. On the other hand, a PMOS transistor 2735 is turned on by output of the OR gate 2734, to thereby charge the node N to the high state. The high state of the node N is maintained by the latches 2738 and 2739.

In the transfer cycle, an output enable signal $\overline{DT/OE}$ is in the low state during the falling edge of the row address strobe RAS, so that a signal PIRX is generated in the high state. As a result, NMOS transistor 2736 is turned on. Also, if the state of the output enable signal $\overline{DT/OE}$ is transited to the high state in a certain time during the falling edge of the row address strobe $\overline{RAS}$, NMOS transistor 2733 is turned on, to thereby discharge the charged state of the node N. As a result, the node N goes to the low state.

In general applications of the video RAM transfer cycle, the high-going edge of the output enable signal $\overline{DT/OE}$ follows before or after the low going edge of the column address strobe $\overline{CAS}$.

If the high going edge of the output enable signal $\overline{DT/OE}$ is generated before the low going edge of the column address strobe $\overline{CAS}$, an internal transfer operation should be asynchronously performed with respect to the external input signal. To the contrary, if the high going edge of the output enable signal $\overline{DT/OE}$ is generated after the low going edge of the column address strobe $\overline{CAS}$, the internal transfer operation should be synchronously performed with respect to the high going edge of the output enable signal $\overline{DT/OE}$ and the high going edge of the serial clock SC.

To perform the above operation, an inverting output of the node N, controlled by the output enable signal $\overline{DT/OE}$, and the TAP address load signal TAL, controlled by the column address strobe $\overline{CAS}$, are both inputted to an AND gate 2740 of FIG. 17. The high state of the latter of the above two input signals is inputted to the node T, and the load enable signal LDEN and the data transfer pulse DTP are generated in the high state through the AND gates 2743 and 2744 and become the high pulses which go the low state by the delays 2741 and 2742. In other words, the delay 2741 determines the pulse width of the load enable signal LDEN, and the delay 2742 determines the pulse width of the data transfer pulse DTP.

Accordingly, as described in the above, the load enable signal LDEN and the data transfer pulse DTP are at least generated following the column address load signal TAL, so that the valid column address loading and data transferring to the data register 22 is performed only after complete sensing of the memory cell is obtained.

Figure 18A:
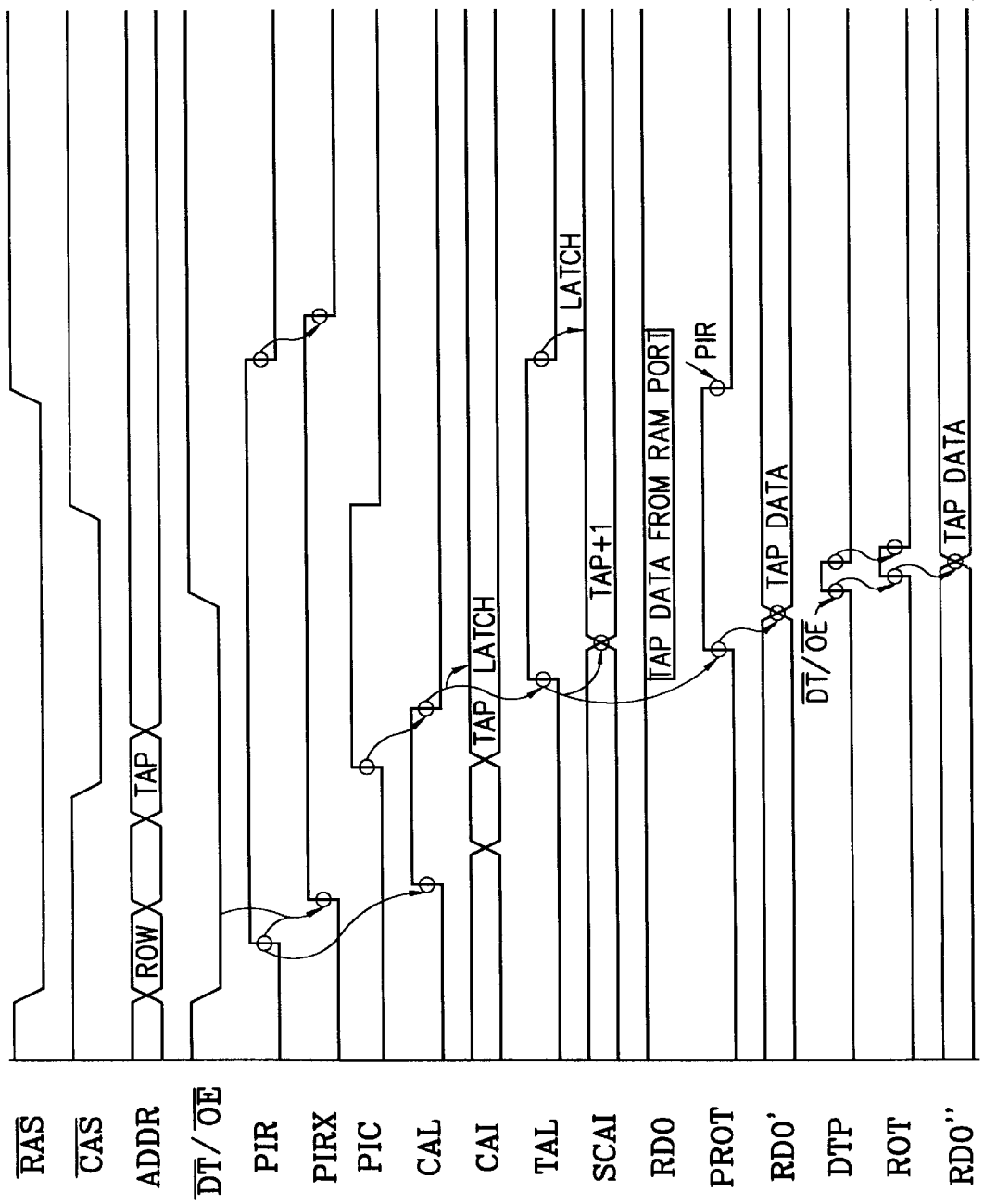
FIGS. 18A and 18B are timing diagrams illustrating timing of serial data output operations during and immediately following a transfer cycle according to one preferred embodiment of the present invention.
Figure 18B:
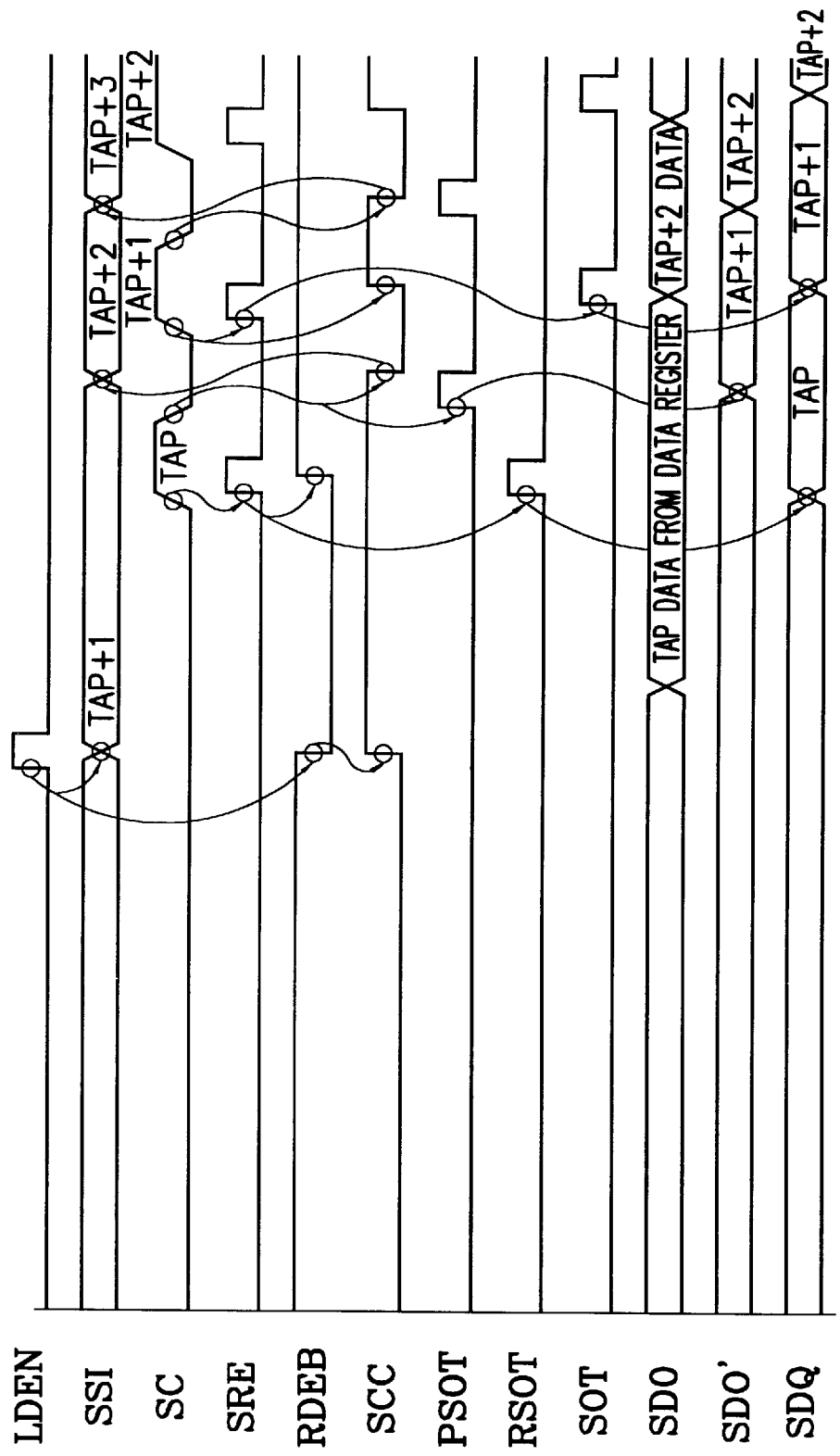
Figure 19:
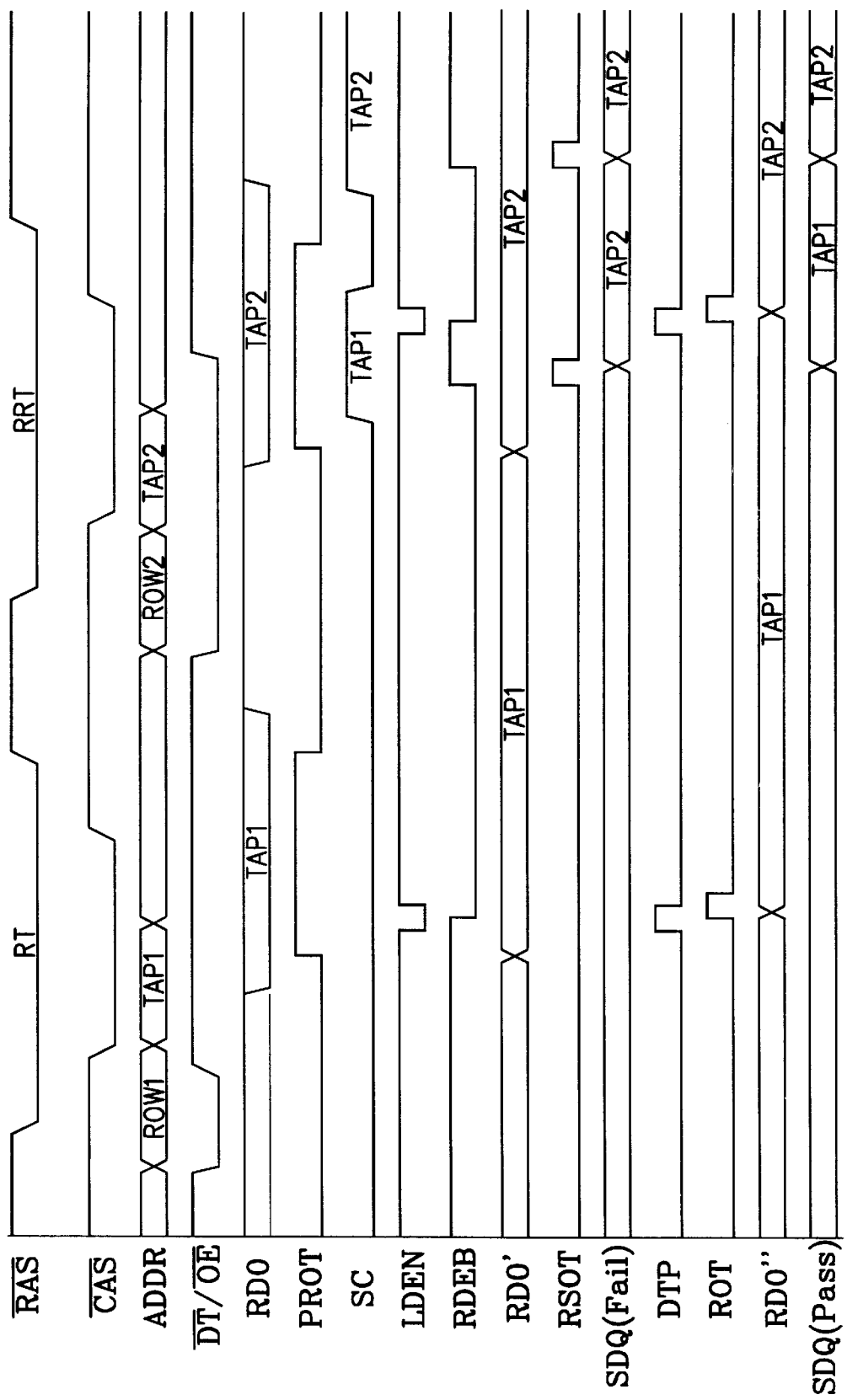
FIG. 19 is an operation timing diagram of an informal transfer cycle according to one embodiment of the present invention.

Operation of the present invention is summarized with reference to the timing diagrams of FIGS. 18 and 19 and the constructions of FIGS. 5 to 17.

FIGS. 18A and 18B are timing diagrams of the transfer cycle according to one preferred embodiment of the present invention. As can be appreciated from FIG. 18A, TAP address data RDO" is provided earlier than the TAP serial clock, which prevents the TAP data output from being delayed.

On the other hand, as shown in FIG. 18B, the added column address TAP+1 is loaded into the serial counter 25 while the TAP data RDO" is transferred to the SAM I/O buffer 26. Data stored in the added column address TAP+1 of the data register 22 exists on data SDO, and then is stored in the SAM I/O buffer 26 by the pulse of the signal PSOT which is generated by the low going edge of the serial clock SC. At this time, data SDO stored in the SAM I/O buffer 26 is transferred to the data SDO' by the pulse SOT generated in the high going edge of the TAP serial clock SC of the added column address TAP+1, thereby making it possible to access serial data at high speeds.

As illustrated in FIGS. 18A and 18B, since data access of the data register 22 is always begun at least 1-½ cycles earlier than the high going edge of the serial clock SC, high speed serial access is possible.

FIG. 19 is an applied operation timing diagram of an informal transfer cycle according to one embodiment of the present invention. FIG. 19 shows the necessity of the D flip-flop 264 which is controlled by the signal ROT and from which data RDO" is outputted in the SAM I/O buffer 26. The D flip-flop 264 is situated in a path for storing TAP data.

In other words, in the case that data operations RT and RRT are successively and continuously performed, wherein the serial clock SC for serially reading data RT is inputted before the high going edge of the output enable signal $\overline{DT/OE}$ of RRT cycle, if there is not the D flip-flop 264 of the SAM I/O buffer 26, output data RDO' of the D flip-flop 263 is overwritten to new TAP data, that is, the column address data designated by the PROT of the RRT cycle, thereby to cause an error. This error can be prevented by controlling the signal ROT generated following the signal DTP by the D flip-flop 264 in the SAM I/O buffer 26.

As set forth in the above, the present invention has an advantage in which delays in outputting TAP data are eliminated by utilizing data from the RAM port, thereby providing high speed serial access. Also, the present invention has an advantage in which the serial access is always begun at least 1-½ cycles earlier than the conventional manner by providing the incremented column address to the serial counter 25. Furthermore, the present invention has an advantage in which the number of the SAM I/O lines connected with the data register 22 can be reduced to a minimum, thereby to reducing an entire area of the memory chip.

The construction for performing the preferred embodiment of the present invention is applicable to all transfer operations of the dual port memory device and the principles thereof are easily applicable to, for example, a split transfer system.

While there have been illustrated and described what are considered to be preferred embodiments of the present invention, it will be understood by those skilled in the art that various changes and modifications may be made thereto without departing from the spirit and scope of the present invention as set forth in the appended claims.

What is claimed is:

1. A memory device, comprising:
  a memory cell array;
  a RAM port which performs random access memory operations between said memory cell array and external devices; and
  a SAM port which performs serial access memory operations between said memory cell array and said external devices, said SAM port including:
    a SAM control circuit which receives a serial clock and forms first and second internal clocks therefrom;
    a start column address incrementer which receives a latched column address and increments said latched column address by an offset address to form an incremented start column address;
    a serial counter which receives said incremented start column address as an initial column address and generates a plurality of column addresses therefrom in response to said first internal clock;
    a SAM data register which stores a row of data from said memory cell array and outputs certain of said row data in response to said plurality of column addresses; and
    a SAM data buffer which receives said certain row data from said SAM data register and serially outputs said certain row data to said external devices in response to said second internal clock.

2. The memory device according to claim 1, wherein said RAM port receives a transfer cycle signal and, in response thereto, retrieves start column address data from said memory cell array and supplies said start column address data to said SAM port, said SAM control circuit forming a third internal clock in response to said transfer cycle signal, said SAM data buffer receiving said start column address data and serially outputting said start column address data to said external devices in response to said third internal clock, said SAM control circuit controlling said third internal clock so that said start column address data is outputted before said certain row data.

3. The memory device according to claim 1, wherein said SAM data register outputs said certain row data corresponding to said incremented start column address simultaneously with said SAM data buffer serially outputting said start column address data.

4. A dual port memory device, comprising:
  a memory cell array;
  row and column address latches which receive and latch row and column addresses, respectively, for accessing a memory cell of said memory cell array;
  a RAM data buffer which stores RAM data accessed by said row and column addresses, said RAM data buffer inputting and outputting said RAM data between said memory cell array and external elements;
  a RAM control circuit which generates and outputs RAM control signals to control random access memory operations between said memory cell array and said external elements;
  a data register which receives row data from said memory cell array and stores said row data therein, said data register receiving a counting address value which designates column data among said row data;
  a serial counter which receives a latched column address from said column address latch and increments said latched column address by an address offset to form a counting start address, said serial counter being synchronized to an external reference clock to count from said counting start address to form said counting address value, and to output said counting address value to said data register;

a SAM data buffer which receives said column data corresponding to said counting address value from said data register and serially outputs said column data in response to output control signals; and a SAM control circuit which receives said external reference clock and said RAM control signals, said SAM control circuit thereby generating and outputting said output control signals to control serial output from said SAM data buffer.

5. The dual port memory device according to claim 4, wherein said RAM control circuit determines a column address set-up and holding time of said column address latch according to a column address strobe.

6. The dual port memory device according to claim 5, wherein said RAM control circuit prevents an invalid column address from being latched during a transfer cycle operation by cutting off a latch control signal after a first column address strobe signal.

7. The dual port memory device according to claim 4, wherein said SAM data buffer includes:

a first data latch for storing therein a start column data received from said RAM data buffer during a transfer cycle;

a second data latch for storing therein said start column data from said first data latch in response to a first RAM data output pulse; and a third data latch for storing therein said start column data from said second data latch in response to a second RAM data output pulse, said start column data being serially output in response to a third RAM data output pulse, said SAM control circuit generating said first, second and third RAM data output pulses to prevent said start column data from being overwritten during a real-time read transfer cycle.

8. The dual port memory device according to claim 7, wherein said SAM data buffer includes:

a fourth data latch for storing therein said column data from said data register; and a fifth data latch for inputting thereto and outputting therefrom said column data latched into said fourth data latch in response to said output control signals, said SAM control circuit generating said output control signals corresponding to each rising edge of said external reference clock received after said transfer cycle.

9. The dual port memory device according to claim 4, wherein said SAM control circuit prevents said serial counter from outputting said counting address value when a new latch address is received from said column address latch.

10. A method for outputting serial data from a dual port memory device having a memory cell array, a RAM port and a SAM port, comprising the steps of:

receiving a transfer signal;

latching a start column address in response to said transfer signal;

transferring a start column data from said memory cell array corresponding to said start column address from said RAM port to said SAM port in response to said transfer signal;

loading row data from said memory cell array into a data register;

adding an offset to said start column address and setting up a counter with an offset start column address;

generating a counting address value from said offset start column address in response to an external clock;

retrieving column data corresponding to said counting address value among said row data from said data register;

serially outputting said start column address data from said SAM port in response to a first cycle of said external clock; and serially outputting said column data from said SAM port in response to cycles of said external clock after said first cycle.

11. The method according to claim 10, wherein said step of serially outputting said start column address data includes the step of preventing said start column address data from being overwritten during a real-time read transfer cycle.

* * * * *